US006597710B2

(12) United States Patent
Vilhelmsson et al.

(10) Patent No.: US 6,597,710 B2
(45) Date of Patent: Jul. 22, 2003

(54) DEVICE AND METHOD FOR TUNING THE WAVELENGTH OF THE LIGHT IN AN EXTERNAL CAVITY LASER

(75) Inventors: Kennet Vilhelmsson, Partille (SE); Tomas Lock, Västra Frölunda (SE)

(73) Assignee: Radians Innova AB, Göteborg (SE)

( * ) Notice: Subject to any disclaimer, the term of this patent is extended or adjusted under 35 U.S.C. 154(b) by 0 days.

(21) Appl. No.: 09/931,403

(22) Filed: Aug. 17, 2001

(65) Prior Publication Data

US 2002/0024979 A1 Feb. 28, 2002

Related U.S. Application Data

(63) Continuation of application No. PCT/SE00/00336, filed on Feb. 18, 2000.
(60) Provisional application No. 60/183,415, filed on Feb. 18, 2000.

(30) Foreign Application Priority Data

Feb. 19, 1999 (SE) .............................................. 9900602

(51) Int. Cl.[7] .............................................. H01S 3/10
(52) U.S. Cl. .......................................... 372/20; 372/102
(58) Field of Search ..................................... 372/20, 102

(56) References Cited

U.S. PATENT DOCUMENTS

| | | | | |
|---|---|---|---|---|
| 4,426,155 A | | 1/1984 | Monchalin .................... 356/452 |
| 5,255,273 A | * | 10/1993 | Nilsson et al. ................. 372/20 |
| 5,319,668 A | * | 6/1994 | Luecke ........................ 372/107 |
| 5,331,651 A | * | 7/1994 | Becker et al. .................. 372/32 |
| 5,347,527 A | * | 9/1994 | Favre et al. .................... 372/20 |
| 5,379,310 A | * | 1/1995 | Papen et al. ................... 372/23 |
| 5,491,714 A | | 2/1996 | Kitamura ...................... 372/92 |
| 5,493,575 A | | 2/1996 | Kitamura ...................... 372/20 |
| 5,548,609 A | | 8/1996 | Kitamura ...................... 372/92 |
| 5,594,744 A | * | 1/1997 | Lefevre et al. ................. 372/20 |
| 5,802,085 A | * | 9/1998 | Lefevre et al. ................. 372/20 |
| 5,862,162 A | | 1/1999 | Maeda .......................... 372/20 |
| 5,867,512 A | * | 2/1999 | Sacher ......................... 372/20 |
| 6,026,100 A | * | 2/2000 | Maeda .......................... 372/20 |

\* cited by examiner

Primary Examiner—Paul Ip
Assistant Examiner—Jeffrey N Zahn
(74) Attorney, Agent, or Firm—Birch, Stewart, Kolasch & Birch, LLP

(57) ABSTRACT

The invention relates to a device and method for tuning the wavelength of the light in an external cavity laser. The external cavity laser comprises an optically amplifying semiconductor chip, a first reflecting surface, an Anti-Reflection (AR) coated semiconductor chip facet, a diffraction grating on which at least part of the beam originating from the AR coated semiconductor chip facet is incident and diffracted back to the optically amplifying semiconductor chip, means for collimating the light emitted from the AR coated semiconductor chip facet towards the diffraction grating, and a movable part. By the movement of the moveable part, the wavelength of the light can be turned in the external cavity laser. The movable part of the external cavity laser exhibits a rotational movement relative to the optical axis of the external movement being actuated by an electrodynamic force generated within an integral section of the moveable part.

10 Claims, 3 Drawing Sheets

DEVICE AND METHOD FOR TUNING THE WAVELENGTH OF THE LIGHT IN AN EXTERNAL CAVITY LASER

This application is a Continuation of PCT International Application No. PCT/SE00/00336 filed on Feb. 18, 2000, which was published in English and which designated the United States and on which priority is claimed under 35 U.S.C. §120, the entire contents of which are hereby incorporated by reference.

Priority of Application No. 9900602-5 filed in Sweden on Feb. 19, 1999 is claimed under 35 U.S.C. §119. Also Priority of Application No. 60/183,415 filed in the US on Feb. 18, 2000 is claimed under 35 U.S.C. §119.

TECHNICAL FIELD

The invention relates to a device and method for precise, fast and continuous tuning of a semiconductor external cavity laser, where the inherent limitations due to friction and mechanical wear are reduced to an absolute minimum.

BACKGROUND ART

For applications where a precise and wavelength tunable laser light source is needed, one is often required to use an external cavity stabilized semiconductor laser. A conventional laser comprises an optically amplifying medium between a first and a second reflecting surface. For a monolithic semiconductor laser these reflective surfaces are usually the end facets of the optically amplifying semiconductor chip. A fixed wavelength monolithic laser can be made tunable by providing an Anti-Reflection (AR) coating on the second semiconductor chip facet and arranging for an external movable second reflecting surface to provide wavelength selection.

A plurality of methods exist for effecting wavelength selectivity, where movable diffraction gratings or movable mirrors acting on stationary gratings are the most common, since they typically provide a large tuning range. There also exist several methods for accessing the laser light propagating between the first and the second reflecting surface through the optically amplifying medium, where a partly reflecting and partly transmitting first reflecting surface is one example. Another method takes advantage of the partly reflected light from the above said stationary grating.

Wavelength selection in the semiconductor external cavity laser and thereby wavelength selection of the output light from the said external cavity laser, is usually accomplished by changing the angle between the collimated beam, which originates at the AR coated semiconductor chip facet, and the surface normal of the diffraction grating. The collimation is normally obtained with a lens arrangement.

The change of incident angle can be accomplished either by moving the diffraction grating itself or by changing the beam direction towards the diffraction grating by moving an auxiliary mirror. In both arrangements, continuous tuning is obtained by coordinating the translation and rotation of the moving part.

The movement of the auxiliary mirror or the diffraction grating, to obtain wavelength variation, is commonly achieved using a mechanical drive in combination with a gear device. One such arrangement is described in U.S. Pat. No. 5,491,714.

It is also well known to use electrical motors in external cavity lasers in order to change the wavelength of the light. These arrangements may typically include worm gear or other types of mechanical gear devices.

A disadvantage of using conventional motors with mechanical drives or gear devices in external cavity lasers, is that such mechanical devices prohibit simultaneous fast and accurate tuning due to the inherent friction. One limitation in particular, results from the inherent compromise when choosing a gear ratio for either high accuracy giving low speed, or alternatively, for high speed giving low accuracy.

Among additional disadvantages in known systems for tuning the wavelength of the light in external cavity lasers are for example mechanical wear, friction generated heat, play, variations in lubrication film thickness and lack of mechanical stiffness which are detrimental to the long-term reliability and system performance.

DISCLOSURE OF THE INVENTION

The problem which is solved by the present invention is the difficulty to vary, at high speed and accuracy, the orientation and, if appropriate, the position of the optical elements which determine the wavelength of the light in the external cavity laser. The invention also makes it possible to vary the wavelength with a minimum of friction generated heat and a minimum of mechanical wear.

The above described problem is solved with this invention by means of a method and a device for tuning the wavelength of the light in an external cavity laser comprising an optically amplifying semiconductor chip, a first reflecting surface, an AR coated semiconductor chip facet and a diffraction grating on which at least part of the beam originating from the AR coated semiconductor chip facet is incident and diffracted back to the optically amplifying semiconductor chip, means for collimating the light emitted from the AR coated semiconductor chip facet towards the diffraction grating, and a movable part by means of the movement of which said part the wavelength of the light can be tuned in the external cavity laser, wherein the movable part of the external cavity laser exhibits a rotational movement relative to the optical axis of the external cavity laser, the optical axis being defined by the center of the beam propagating between the first and the second reflecting surface, said movement being actuated by an electrodynamic force generated within an integral section of said movable part.

By virtue of the fact that the movement of the movable part in the external cavity laser is brought about by an electrodynamic force being produced in an integral section of the movable part, the electrodynamic force can be used to directly influence the movement, and thus the wavelength of the light in the external cavity laser. In this way, there is no longer any need for intermediate gear devices and alike. As a result the movable part of the external cavity laser is made to move with a minimum of friction, and its movement and thus the wavelength of the light in the external cavity laser can be tuned precisely, fast and continuously within a large wavelength range.

In one embodiment of the invention, the movable part of the device consists of a rotatable arm on which the diffraction grating of the device is arranged. In an alternative embodiment of the invention the device can also comprise an auxiliary mirror on which at least part of the light diffracted from the diffraction grating is incident and reflected back towards the diffraction grating, in which device said movable part consists of a rotatable arm on which the auxiliary mirror is arranged The integral section of the movable part where an electrodynamic force is produced, can comprise either a first magnet with the electrodynamic force being produced in interaction with a stationary first coil through which electrical current is passed, or a first coil through which electrical current is passed, with the electrodynamic force being produced in interaction with a stationary first magnet.

In a preferred embodiment, the device also comprise at least one second coil and, associated with it, at least one second magnet, either of the two preferably being arranged on the movable part of the device, the electromagnetic interaction of the second coil and the second magnet being used for detecting movement of the movable part.

When, under the influence of the electrodynamic force, the movable part moves, the second magnet will therefore also perform a movement in relation to the second coil or vice versa, as a result of which a voltage is induced in the second coil. This electromagnetic interaction between the second coil and the second magnet, in other words, the voltage induced in the second coil, is used for detecting the movement of the movable part. The information regarding the movement of the movable part can in turn be used in a control system for improving the control of the wavelength of the light in the external cavity laser.

DESCRIPTION OF THE FIGURES

The invention will be described in greater detail below by means of examples of embodiments, and with reference to the appended drawings, in which.

EMBODIMENTS

Figure 1:
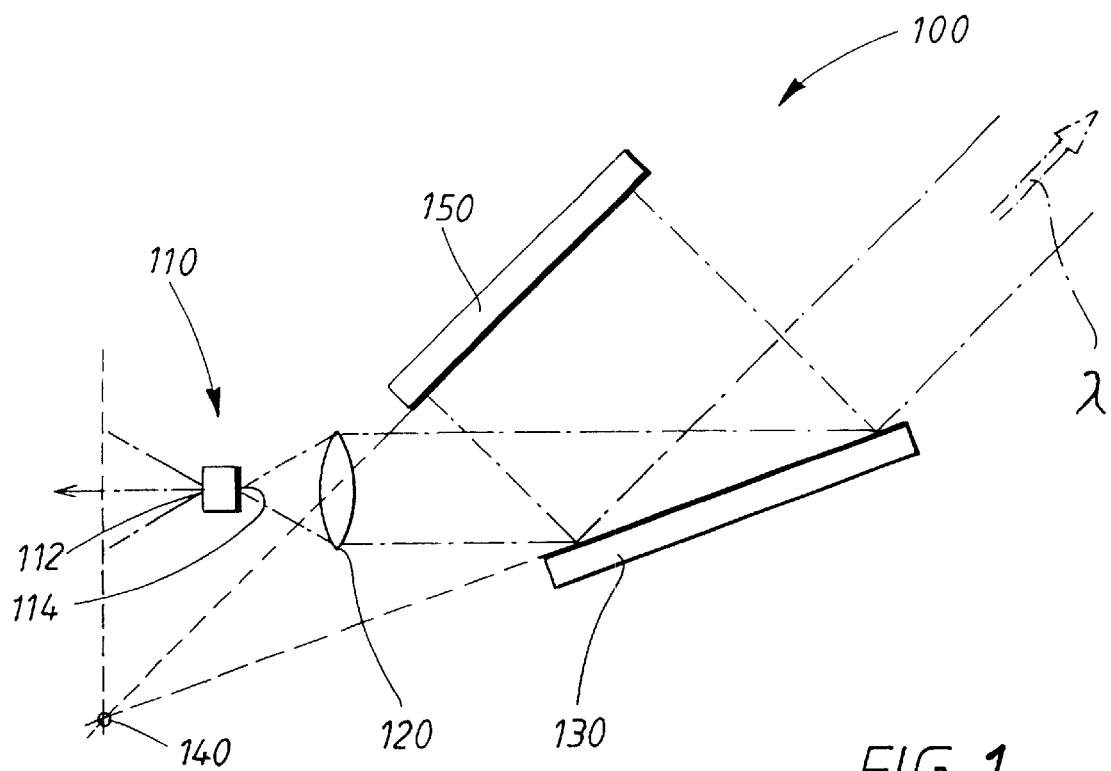
FIG. 1 shows the principle of one variant of an external cavity laser.

FIG. 1 shows a basic diagram of an external cavity laser (100) in which the invention can be applied. The external cavity laser (100) is constructed according to what is known as the Littman configuration, which will be explained below.

The external cavity laser (100) comprises an optically amplifying semiconductor chip (110), a first reflecting surface (112), an AR coated semiconductor chip facet (114), a diffraction grating (130), a collimating lens arrangement (120) and an auxiliary mirror (150) arranged on a movable part. The light which is emitted through the AR coated semiconductor chip facet (114) of the optically amplifying semiconductor chip (110), will be incident on the diffraction grating (130), towards which the light is collimated by means of a lens arrangement (120). From the diffraction grating (130), the light will be completely or partly diffracted towards the auxiliary mirror (150) and completely or partly reflected back towards the optically amplifying semiconductor chip (110), via the diffraction grating (130) and the collimating lens arrangement (120).

The auxiliary mirror (150) is arranged on a movable part, which rotates about the axis of rotation (140). By rotating the auxiliary mirror (150), about its axis of rotation (140) and in this way varying the angle and the distance between the auxiliary mirror (150) and the diffraction grating, it is possible to vary the wavelength of the light in the external cavity laser (100) and thereby also varying the wavelength λ of the light in the output beam, indicated in FIG. 1 by an arrow in the direction in which the light is emitted from the laser (100).

Figure 2:
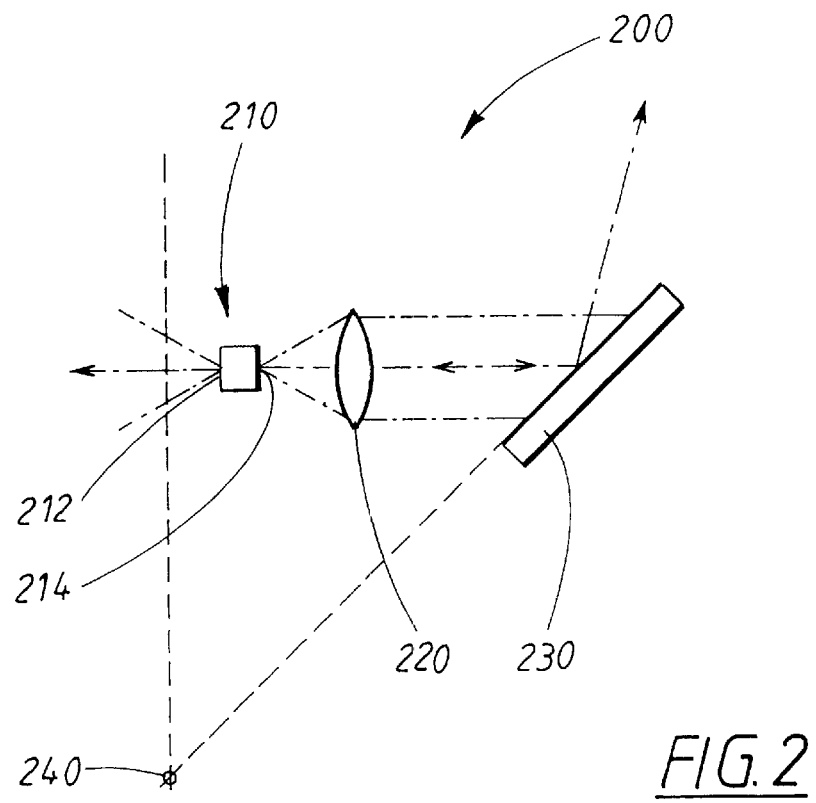
FIG. 2 shows the principle of another variant of external cavity laser in which the invention can be applied.

FIG. 2 shows an external cavity laser (200), which is designed according to what is known as the Littrow configuration, which will be described below.

Like the external cavity laser (100) designed according to the Littman configuration, the external cavity laser (200) according to the Littrow configuration comprises optically amplifying medium (210), suitably an optically amplifying semiconductor chip. The optically amplifying semiconductor chip has a first reflecting surface (212), suitably a reflecting semiconductor chip facet, and an AR coated semiconductor chip facet (214).

Light is emitted from the optically amplifying semiconductor chip (210) through the AR coated second semiconductor chip facet (214) towards a diffraction grating (230). The light towards the diffraction grating is collimated by means of a lens arrangement (220). From the grating (230), the light is completely or partly reflected back towards the optically amplifying semiconductor chip (210) via the lens arrangement (220), which also focuses the beam from the diffraction grating towards the optically amplifying semiconductor chip (210).

The light from the optically amplifying semiconductor chip (210) is also accessible via the first reflecting surface (212), in this configuration suitably being partly reflecting and partly transmitting, of the optically amplifying semiconductor chip. The laser light from this first reflecting surface of the optically amplifying semiconductor chip is accessed in a well-known manner, for someone knowledgeable in the field, and will therefore not be described in greater detail here.

As indicated in FIG. 2, the diffraction grating (230) is pivotable about an axis of rotation (240). The diffraction grating is arranged on a movable part, preferably an arm (not shown) in the device (200). By rotating the diffraction grating (230), about its axis of rotation (240) and in this way varying the angle between the collimated beam and the surface normal of the diffraction grating, and simultaneously also changing the length of the optical path between the diffraction grating and the first reflecting surface (212) of the optically amplifying semiconductor chip, it is possible to continuously vary the wavelength λ of the light in the external cavity laser (200). In other words the laser light which is brought out via the first reflecting surface (212) of the optically amplifying semiconductor chip, can be continuously varied by the grating (230) being pivoted about the axis of rotation (240).

As has emerged from the above description, an external cavity laser, irrespective of whether it is designed according to the Littman or the Littrow configuration, or any other configuration, comprises a movable part, by means of the movement of which the wavelength of the laser light emitted by the laser can be tuned. The main field of the present invention relates to a device and a method for precise, fast and continuous tuning of a semiconductor external cavity laser, where the inherent limitations due to friction and mechanical wear are reduced to an absolute minimum. In both configurations mentioned above, continuous tuning is obtained by coordinating the translation and rotation of the moving part.

A device and method according to the invention will now be described in connection with FIG. 3, which shows a device (300) according to the invention. The laser wavelength emitted by the device (300) is varied according to the Littrow configuration described above, but it will be understood that the invention can also be applied to an external cavity laser designed according to the Littman configuration.

The device (300), an external cavity laser, comprises an optically amplifying semiconductor chip (310). According to the method described above, the optically amplifying semiconductor chip (310) has a first reflecting surface (312), suitably a reflecting chip facet, and a non-reflecting AR coated semiconductor chip facet (314). The light which is emitted through the AR coated semiconductor chip facet is collimated by means of a lens arrangement (320) towards a diffraction grating (330), which is arranged on a movable part, suitably a pivotable or a rotatable arm (360), which rotates about an axis, with a center of rotation (340).

By moving the arm (360) in the directions shown by the arrow (390), the angle between the collimated beam and the surface normal of the diffraction grating (330), and the length of the optical path between the diffraction grating and the first reflecting surface (312) of the optically amplifying semiconductor chip can be varied simultaneously, as a result of which the wavelength of the laser light in the device can also be continuously varied. The light can be brought out of the device via, for example, a second lens (392) and a third lens (395), as shown in FIG. 3, by means of which the light is guided into an optical fiber (398). The light being guided into an optical fiber is of course only an example of an application of the device according to the invention, and other applications are possible.

According to the invention, the movable arm (360) comprises a first magnet (370), which is arranged on the arm. Arranged around the first magnet is a stationary first coil (374). The first magnet (370) and the first coil (374) interact so as to produce an electrodynamic force, which in turn will cause the arm to move. The electrodynamic force is developed by passing current through the coil. By passing current through the first coil and generating an electrodynamic force, the first magnet, and thus the arm, can be caused to move around the center of rotation (340), which is used for tuning the wavelength of the light in the external cavity laser in a desired manner.

As the coil causes the magnet, and thus the arm, to move without being in contact with either the magnet or the arm, the arm will move with a minimum of frictional forces. The only remaining source of frictional forces is the mounting of the arm (360) about the axis (340). In this way, a control of the wavelength emitted by the device (300) is achieved which affords high accuracy, high speed and a minimum of friction and mechanical wear.

A device according to the invention can be used to vary the wavelength emitted by an external cavity laser to an optional wavelength within a large interval, the interval being mainly defined by the properties of the optically amplifying medium used.

The invention clearly also makes possible a design in the opposite manner as far as the parts which produce the electrodynamic force described above are concerned, in other words the movable arm can instead comprise the coil, while the first magnet (370) is stationarily arranged to interact with the coil (374), without being arranged on the arm (360).

In order to further increase tuning speed and accuracy, the device (300) can also comprise a second magnet (372), which is arranged in a fixed manner on the movable arm (360). Arranged around the second magnet is a second coil (376). When the first coil (374) interacts electrodynamically with the first magnet (370) causing the arm to move, the second magnet (372) will also move in relation to the second coil (376). This movement of the second magnet (372) will, because of electromagnetic induction, generate a voltage in the second coil (376).

As the voltage in the second coil (376) will vary, depending on the velocity of the moving arm (360), the voltage in the second coil can be used for detecting the velocity of the moving arm, which can in turn be used in a control system for improving the control of the wavelength of the light in the device (300).

In order to achieve both accurate positional and velocity control in the device (300), an additional device is needed for detecting the position of the arm (360). These means preferably comprise a secondary light source (380), suitably a laser diode, and what is known as a PSD, Position Sensitive Detector, (385). The secondary light source (380) is arranged so that its emitted light is incident on the diffraction grating (330), and reflected towards the PSD (385).

A PSD is a well-known device and will therefore not be described in greater detail here, but briefly, two currents are generated in the PSD when its surface is illuminated by a light beam. The difference between these two currents, divided by their sum, indicates where the light beam illuminates the surface of the PSD, which means that it is possible to obtain information from this regarding the position of the diffraction grating, and thus the position of the movable part. The information regarding the position of the arm, is suitably used in the above mentioned control system together with the information regarding the velocity of the moving arm, so that it is possible to control rapidly and very accurately the position of the arm, and thus also the wavelength of the laser light emitted by the external cavity laser.

Figure 4:
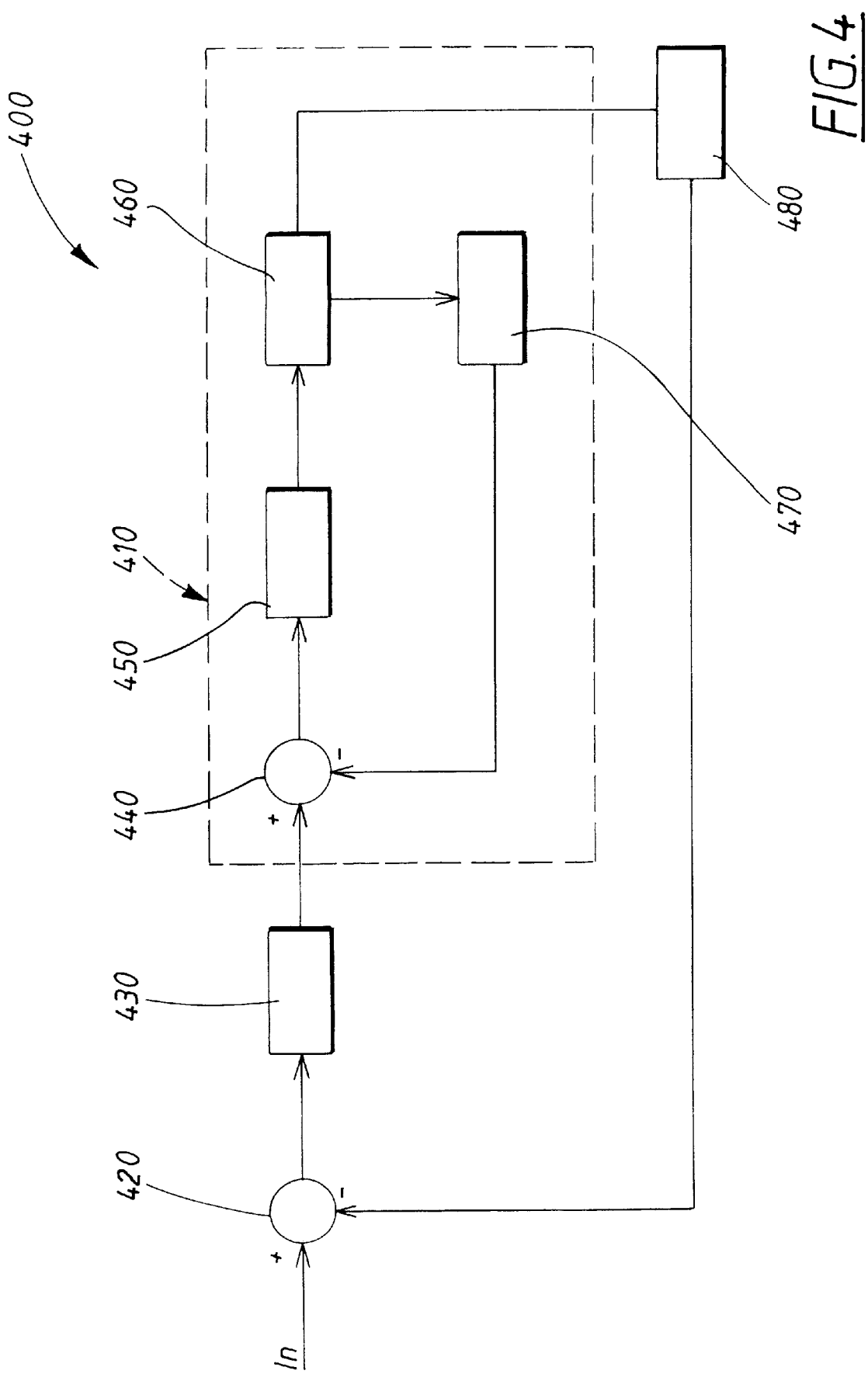
FIG. 4 shows a block diagram of a control system which is used in a preferred embodiment of the invention.

FIG. 4 shows a block diagram of a control system (400) which is suitably used in the invention in order to control the movement of the arm by means of information regarding the position and the velocity of the arm. The control system (400) comprises a first summing node (420) and a second summation node (440), a first controller (430) and a second controller (450), a velocity sensor (470), a position sensor (480) and a motor (460).

Figure 3:
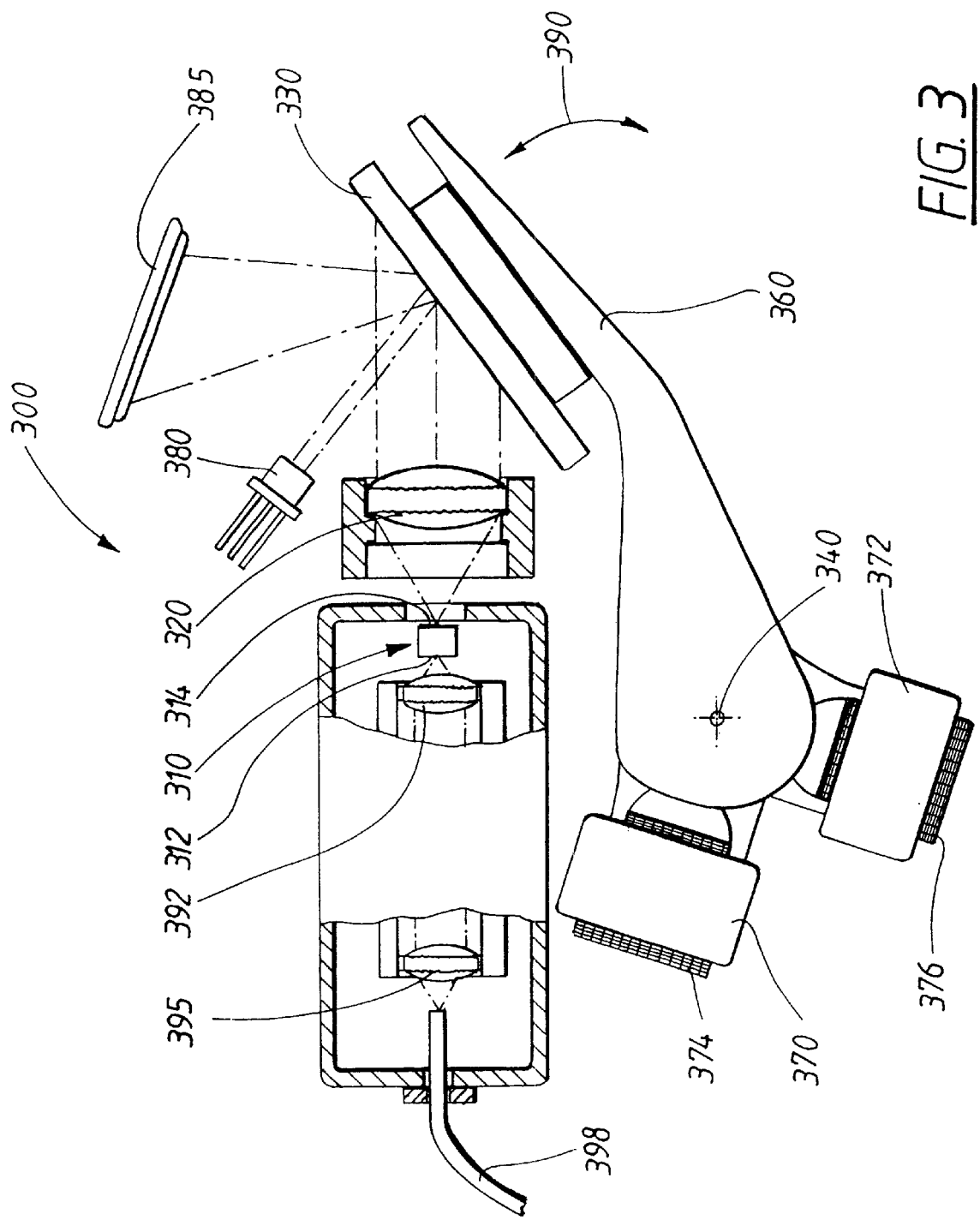
FIG. 3 shows a basic diagram of a device according to the invention.

The velocity sensor (470) in the control system (400) is suitably the second coil (376) in interaction with the second magnet (372) which, according to the description above in connection with FIG. 3, can be used for detecting movement of the movable part in a device according to the invention.

The motor (460) in the control system (400) suitably consists of the first coil (374) in interaction with the first magnet (370) which, according to the description above in connection with FIG. 3, can be used for causing the movable part to move in a device according to the invention.

The position sensor (480) in the control system (400) suitably consists of a PSD, the functioning of which has been described above in connection with FIG. 3.

The functioning of the control system (400) will now be described in greater detail. The position of the movable part in the device is detected by the position sensor (480) and is used as input data to the first summing node (420). A desired value for the position of the movable part in the device according to the invention is used as additional input data to the first summing node (420). The output from the first summing node (420) is therefore a position error between the desired position and the actual position of the movable part in the device, which is used as input data to a first controller (430).

Output data from the first controller (430) is used as input data to a second summing node (440). The value from the velocity sensor (470) is used as additional input data to the second summing node (440). The differential value, from the second summing node (440), forming a velocity error value, is used as input data to second controller (450), which controls the motor (460).

The control system (400) can therefore be considered to consist of a control loop which itself comprises a nested control loop (410), where the internal control loop (410) handles the velocity of the movable part in the device.

The invention is not limited to the examples of embodiments described above, but can be varied freely within the scope of the patent claims below. For example, the electrodynamic forces which form part of the invention can be brought about in a great many ways within the scope of the invention.

The optically amplifying medium included in the external cavity laser has throughout been described as an optically amplifying semiconductor chip, with one AR coated semiconductor chip facet, but other types of optically amplifying media are of course possible. If other types of optically amplifying media are used, the first reflecting surface can also, for example, be arranged mechanically separately from the optically amplifying medium.

What is claimed is:

1. A device for tuning the wavelength of a light in an external cavity laser comprising:

an optically amplifying semiconductor chip including a first reflecting surface and an Anti-Reflection (AR) coated semiconductor chip facet;

collimating means for collimating a light beam emitted from the optically amplifying semiconductor chip through the AR coated semiconductor chip facet;

a diffraction grating on which at least a part of the light beam, emitted through the AR coated semiconductor chip facet, is incident and diffracted back to the optically amplifying semiconductor chip;

a movable part on which the diffraction grating is arranged, wherein the wavelength of the light can be tuned in the external cavity laser by moving the movable part, wherein the movable part of the external cavity laser exhibits a rotational movement for positioning the diffraction grating in relation to an optical axis of the external cavity laser, the optical axis being defined by the center of the light beam propagating between the optically amplifying semiconductor chip and the diffraction grating, said movement being actuated by a magnetic force generated within an integral section of said movable part, said magnetic force being produced by a magnet interacting with a coil.

2. The device according to claim 1, further comprising an auxiliary mirror on which at least part of the light diffracted from the diffraction grating is incident and reflected back towards the diffraction grating, wherein said movable part consists of a rotatable arm on which the auxiliary mirror is arranged.

3. The device according to claim 1, further comprising at least one second coil and, associated with it, at least one second magnet, the electromagnetic interaction between the at least one second coil and the at least one second magnet is used for detecting movement of the movable part.

4. The device according to claim 3 wherein the detected movement of the movable part can in turn be used in a control system for improving the control of the wavelength of the light in the external cavity laser.

5. The device according to claim 1, further comprising means for detecting the position of the movable part, wherein the position of the movable part is used in said control system for controlling the wavelength of the light in the external cavity laser.

6. The device according to claim 5, wherein the means for detecting the position of the rotatable arm comprise a Position Sensitive Detector (PSD) and a secondary light source which is used for generating light which is detected by the PSD.

7. A Method for tuning the wavelength of a light in an external cavity laser, comprising:

emitting a light beam from an optically amplifying semiconductor chip having a first reflecting surface and an anti-reflection (AR) coated semiconductor chip facet;

collimating the light beam emitted from the optically amplifying semiconductor chip through the AR coated semiconductor chip facet;

diffracting at least part of the light beam emitted through the AR coated semiconductor chip facet back to the optically amplifying semiconductor chip;

tuning the wavelength of the light in the external cavity by moving a movable part on which a diffraction grating used for diffracting the light beam is arranged;

wherein a rotational movement of the movable part is provided for positioning said diffraction grating in relation to an optical axis of the external cavity laser, the optical axis being defined by the center of the light beam propagating between the optically amplifying semiconductor chip and the diffraction grating, said movement being actuated by a magnetic force generated within an integral section of the movable part, said magnetic force being produced by a magnet interacting with a coil.

8. The method according to claim 7, further comprising:

detecting the rotational movement of the movable part by means of electromagnetic interaction between a second coil and a second magnet associated with said second coil.

9. The method according to either of claims 7, or 11, wherein the detected movement of the movable part is used in a control system for controlling the wavelength of the light in the external cavity laser.

10. The method according to claim 7, further comprising detecting the position of the movable part, which is used in said control system for controlling the wavelength of the light in the external cavity laser.

* * * * *